(12) United States Patent
Yang et al.

(10) Patent No.: US 7,943,986 B2
(45) Date of Patent: May 17, 2011

(54) METHOD FOR FABRICATING A BODY CONTACT IN A FINFET STRUCTURE AND A DEVICE INCLUDING THE SAME

(75) Inventors: Kuo-Nan Yang, Hsin-Chu (TW); Yi-Lang Chen, Miaoli (TW); Hou-Yu Chen, Kaohsiung (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 94 days.

(21) Appl. No.: 11/761,547

(22) Filed: Jun. 12, 2007

(65) Prior Publication Data
US 2007/0228372 A1    Oct. 4, 2007

Related U.S. Application Data

(62) Division of application No. 10/968,229, filed on Oct. 19, 2004, now Pat. No. 7,244,640.

(51) Int. Cl.
*H01L 29/66* (2006.01)
(52) U.S. Cl. .................. 257/328; 257/E29.261
(58) Field of Classification Search .................. 257/328, 257/E29.261
See application file for complete search history.

(56) References Cited

U.S. PATENT DOCUMENTS

| | | | |
|---|---|---|---|
| 4,996,574 A | 2/1991 | Shirasaki | |
| 5,565,368 A | 10/1996 | Tsuji | |
| 5,574,294 A | 11/1996 | Shepard | |
| 5,646,058 A | 7/1997 | Taur et al. | |
| 5,965,914 A * | 10/1999 | Miyamoto | 257/331 |
| 6,049,110 A | 4/2000 | Koh | |
| 6,165,828 A | 12/2000 | Forbes et al. | |
| 6,252,284 B1 * | 6/2001 | Muller et al. | 257/412 |
| 6,387,739 B1 | 5/2002 | Smith, III | |
| 6,440,806 B1 * | 8/2002 | Xiang | 438/290 |
| 6,706,571 B1 | 3/2004 | Yu et al. | |
| 6,858,478 B2 | 2/2005 | Chau et al. | |
| 6,953,738 B2 | 10/2005 | Veeraraghavan et al. | |
| 7,190,050 B2 | 3/2007 | King et al. | |
| 7,247,887 B2 | 7/2007 | King et al. | |

(Continued)

OTHER PUBLICATIONS

Edward J. Nowak et al., "Turning Silicon On Its Edge," Overcoming Silicon Scaling Barriers With Double-Gate and FinFET Technology, Jan./Feb. 2004, pp. 20-30, IEEE Circuits & Devices Magazine, 8755-3996/04.

(Continued)

*Primary Examiner* — Bradley K Smith
*Assistant Examiner* — Amar Movva
(74) *Attorney, Agent, or Firm* — Haynes and Boone, LLP

(57) ABSTRACT

A method for fabricating a Finfet device with body contacts and a device fabricated using the method are provided. In one example, a silicon-on-insulator substrate is provided. A T-shaped active region is defined in the silicon layer of the silicon-on-insulator substrate. A source region and a drain region form two ends of a cross bar of the T-shaped active region and a body contact region forms a leg of the T-shaped active region. A gate oxide layer is grown on the active region. A polysilicon layer is deposited overlying the gate oxide layer and patterned to form a gate, where an end of the gate partially overlies the body contact region to complete formation of a Finfet device with body contact.

15 Claims, 6 Drawing Sheets

U.S. PATENT DOCUMENTS

| | | |
|---|---|---|
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |

OTHER PUBLICATIONS

Bartlomiej Jan Pawlak, et al., U.S. Appl. No. 12/569,689, "Method of Fabricating Finfet Device," filed Sep. 29, 2009, 21 pages.

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method For Incorporating Impurity Element In EPI Silicon Process," filed Dec. 22, 2009, 21 pages.

Tsung-Lin Lee, et al., U.S. Appl. No. 12/622,038, "Sacrificial Offset Protection Film For A Finfet Device," filed Nov. 19, 2009, 56 pages.

Jeff J. Xu, et al., U.S. Appl. No. 12/784,207, "Method of Forming EPI Film In Substrate Trench," filed May 20, 2010, 33 pages.

Tian-Choy, et al., U.S. Appl. No. 12/756,552, "Hybrid Gate Process For Fabricating Finfet Device," filed Apr. 8, 2010, 38 pages.

Ming-Lung Cheng, et al. U.S. Appl. No. 12/780,124, "Method and Apparatus For Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit For Finfet Devices," filed Jun. 30, 2010, 32 pages.

Jhon Jhy Liaw, U.S. Appl. No. 12/823,860, "Structure And Method For SRAM Cell Circuit," filed Jun. 25, 2010, 37 pages.

Jhon Jhy Liaw, et al., U.S. Appl. No. 12/827,690, "Layout For Multiple-Fin SRAM Cell," filed Jun. 30, 2010, 35 pages.

Jeng-Jung Shen, et al., U.S. Appl. No. 12/780,060, "Automatic Layout Conversion For Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device And Method Of Fabricating," filed Jul. 21, 2010, 21 pages.

Peng-Soon Lim, et al., U.S. Appl. No. 12/827,512, "Gate Structures And Method Of Fabricating Same," filed Jun. 30, 2010, 41 pages.

Tsu-Hsiu Perng, et al., U.S. Appl. No. 12/837,093, "Fin-Like Field Effect Transistor (Finfet) Device And Method Of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor On Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device And Method Of Manufacturing Same," filed Oct. 18, 2010, 55 pages.

Jeff J. Csu, et al, U.S. Appl. No. 12/917,902, "Fin-Like Field Effect Transistor (FINFET) Device And Method Of Manufacturing Same," filed Nov. 2, 2010, 61 pages.

Mark van Dal, U.S. Appl. No. 12/900,895, "Method Of Fabricating A Semiconductor Device Having An Epitaxly Region," filed Oct. 8, 2010, 21 pages.

Hsin-Chih Chen, et al, U.S. Appl. No. 12/907,272, "Multi-Fin Device By Self-Aligned Castle Fin Formation," filed Oct. 19, 2010, 34 pages.

Chien-Hsun Wang, et al, U.S. Appl. No. 12/952,376, "Method For Adjusting Fin Width In Integrated Circuitry," filed Nov. 23, 2010, 27 pages.

Chien-Shun Wang, et al, U.S. Appl. No. 12/949,881, "Method For Forming Metrology Structures From Fins In Integrated Circuitry," filed Nov. 19, 2010, 16 pages.

Chien-Hsun Wang, et al, U.S. Appl. No. 12/953,148, "Device And Method For Forming Fins In Integrated Circuitry," filed Nov. 23, 2010, 39 pages.

\* cited by examiner

METHOD FOR FABRICATING A BODY CONTACT IN A FINFET STRUCTURE AND A DEVICE INCLUDING THE SAME

RELATED APPLICATIONS

This application is a divisional of U.S. application Ser. No. 10/968,229 filed Oct. 19, 2004, which is hereby incorporated by reference.

FIELD OF THE INVENTION

The present disclosure relates to a method of fabricating a Finfet device, and more particularly, to a method of forming a Finfet device having a body contact in the fabrication of an integrated circuit device and a device including such a body contact.

BACKGROUND

FIG. 1 illustrates an example of a Finfet device 10; that is, a field effect transistor (FET) having fins. In the figure are shown a gate 12, source 14, drain 16, and gate 18 surrounding a channel 22. A fin structure is one kind of device having a multi-gate structure 20, having a better subthreshold swing, better scaling ability, and lower parasitic leakage than non-fin structures. As shown, typically no body contact exists. However, for some input/output circuits and test patterns, there should be a body contact for parameter extraction and functional operation. In a device with a bulk contact, gate oxide thickness may be measured using the capacitance-to-voltage curve. Such a measurement cannot be done without a body contact.

SUMMARY

Accordingly, it is an object of one embodiment of the present disclosure to provide an effective and manufacturable process for fabricating a Finfet device having a body contact.

Another object of one embodiment of the present disclosure is to provide a method for fabricating a Finfet device having a T-shaped active region.

In accordance with the objects of various embodiments of the present disclosure, one embodiment of a method for fabricating a Finfet device with body contacts may be achieved. A silicon-on-insulator substrate is provided. A T-shaped active region is defined in the silicon layer of the silicon-on-insulator substrate wherein a source and a drain region form two ends of a cross bar of the T-shaped active region and wherein a body contact region forms a leg of the T-shaped active region. A gate oxide layer is grown on the active region. A polysilicon layer is deposited overlying the gate oxide layer and patterned to form a gate wherein an end of the gate partially overlies the body contact region to complete formation of a Finfet with body contact in the fabrication of an integrated circuit.

Also in accordance with at least some objects of this disclosure, one embodiment of a Finfet device is achieved. The Finfet device comprises a T-shaped active region wherein a source and a drain region form two ends of a cross bar of the T-shaped active region and wherein a body contact region forms a leg of the T-shaped active region and a polysilicon gate overlying a gate oxide layer wherein an end of the gate partially overlies the body contact region.

BRIEF DESCRIPTION OF THE DRAWINGS

In the following drawings forming a material part of this description, there is shown.

DETAILED DESCRIPTION

Figure 1:
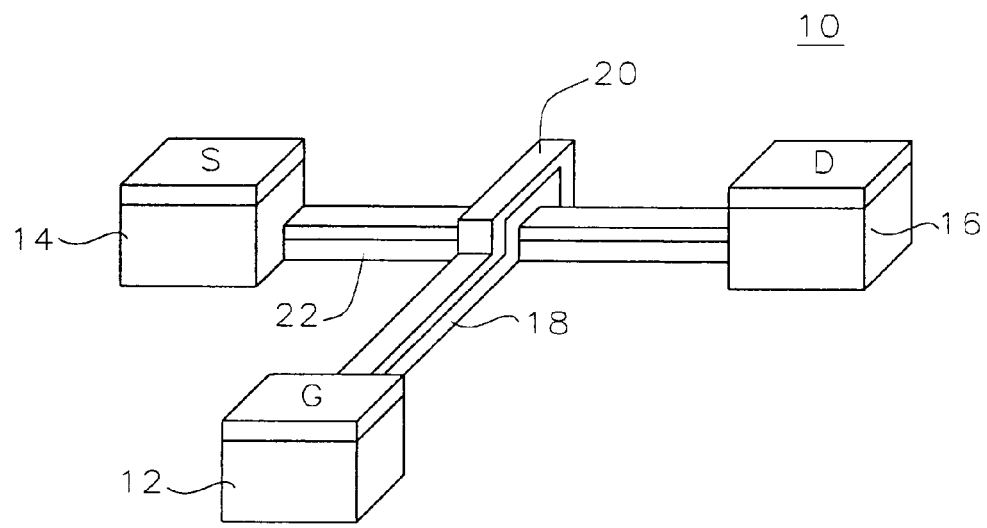
FIG. 1 is an isometric representation of a prior art Finfet device without body contacts.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 3:
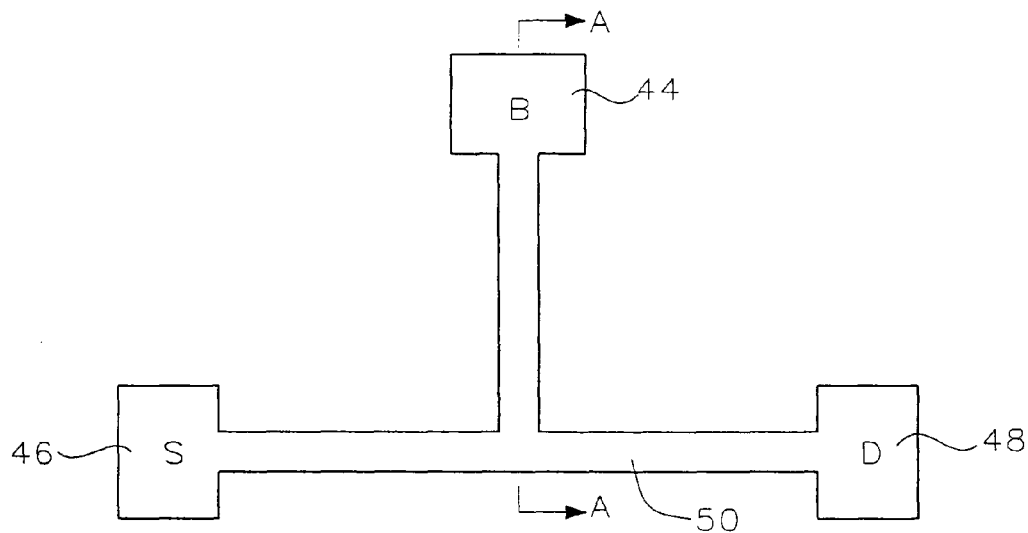
FIGS. 3, 5, 7, and 9 are top views of one embodiment of the present disclosure.
Figure 4:
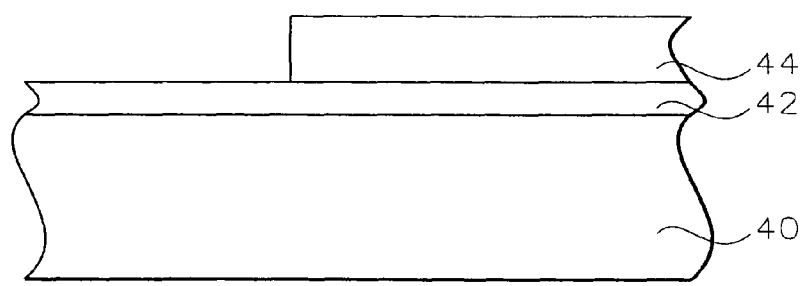
FIGS. 4, 6, 8, and 10 are schematic cross-sectional representations of view A-A of FIGS. 3, 5, 7, and 9, respectively.

In one embodiment, the process of the present disclosure provides a method for fabricating a Finfet device with a body contact. Referring now more particularly to FIGS. 3 and 4, there is shown a partially completed integrated circuit device. A silicon-on-insulator device is provided. The silicon-on-insulator device comprises a first semiconductor substrate 40 preferably composed of silicon having a (100) crystallographic orientation. An insulating layer 42 lies on top of the semiconductor substrate 40. A silicon layer 44 is formed overlying the insulating layer 42.

The silicon layer 44 is patterned to define a fin region 50, source 46, drain 48, and body contact 44, as shown in top view in FIG. 3. Typically, the silicon layer 44 has a thickness of between about 100 and 1000 Angstroms. The silicon layer 44 is etched all the way to the buried oxide layer to form the device regions as shown. FIG. 4 shows the cross-section A-A of FIG. 3. Body contact region 44 is shown in FIG. 4. An ion implantation may be performed to adjust the silicon doping. For example, boron or arsenic ions may be implanted with a dosage of between about 1E11 and 1E15 ions/cm$^2$ at an energy of between about 1 and 30 KeV. The source/drain regions will be doped with a higher dosage of more than about 1E15 ions/cm$^2$ to obtain a small sheet resistance.

Figure 5:
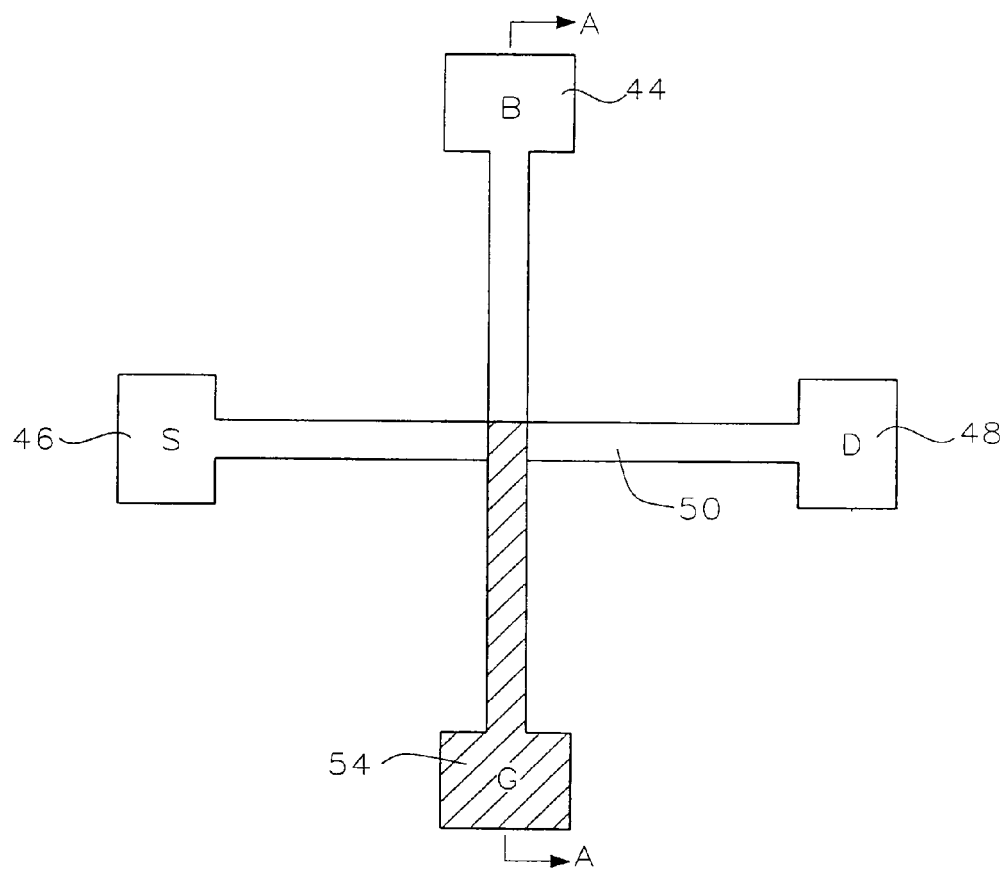
Figure 6:
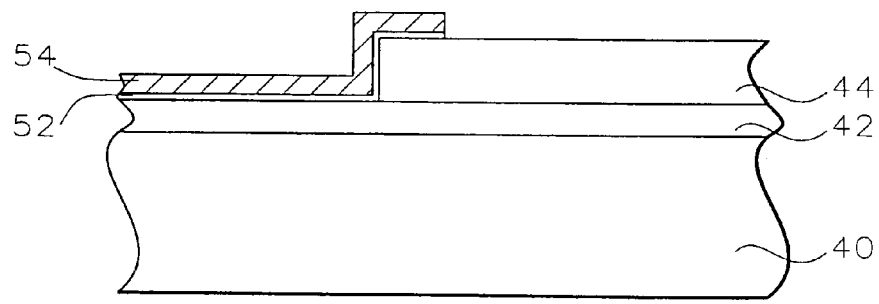

Referring to FIGS. 5 and 6, the gate electrode may be fabricated as follows. A gate dielectric layer 52 such as an oxide layer is grown over the silicon fin, including the source, drain, and channel regions 46, 48, and 50, and the body region 44 to a thickness of between about 5 to 100 Angstroms. The gate dielectric layer may also be nitrided oxide or any dielectric material having a high dielectric constant greater than about 5. A gate polysilicon layer 54 is deposited over the gate dielectric layer 52 and patterned to form the gate, as shown in top view in FIG. 5 and in cross-section in FIG. 6. The gate polysilicon layer 54 is deposited by low pressure chemical vapor deposition (LPCVD) to a thickness of between about 300 and 2000 Angstroms. Other gate materials could be used, such as, for example, polysilicon germanium or metals.

Figure 7:
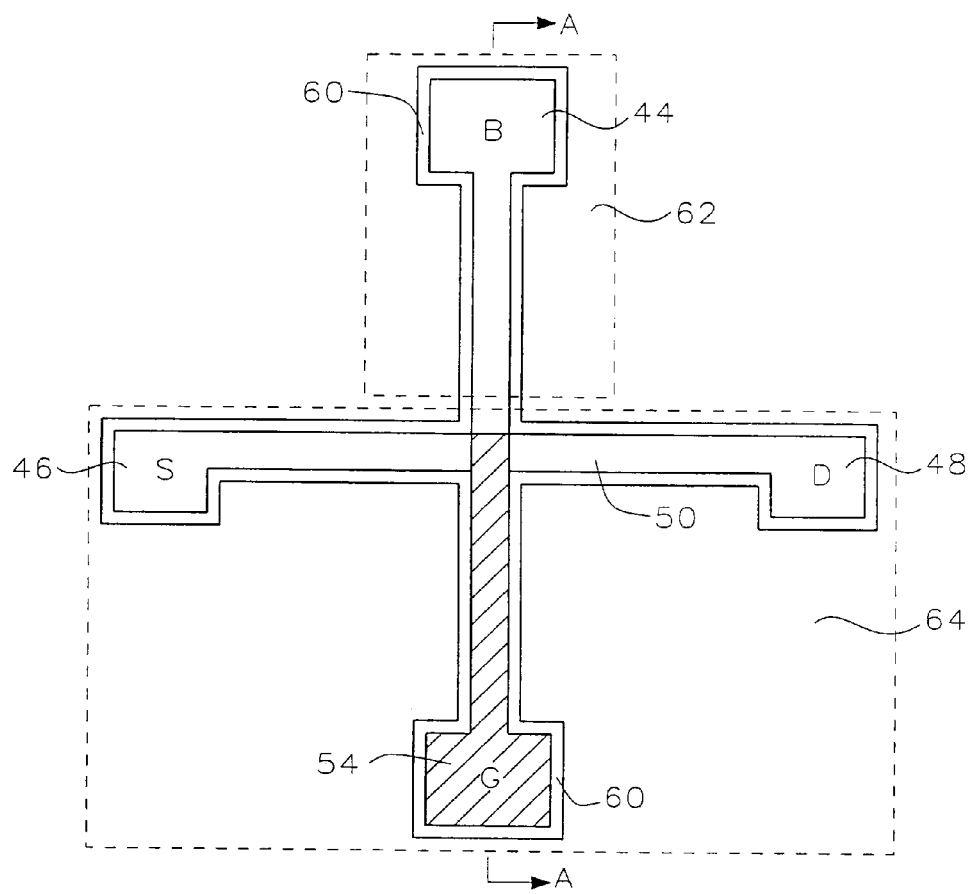
Figure 8:
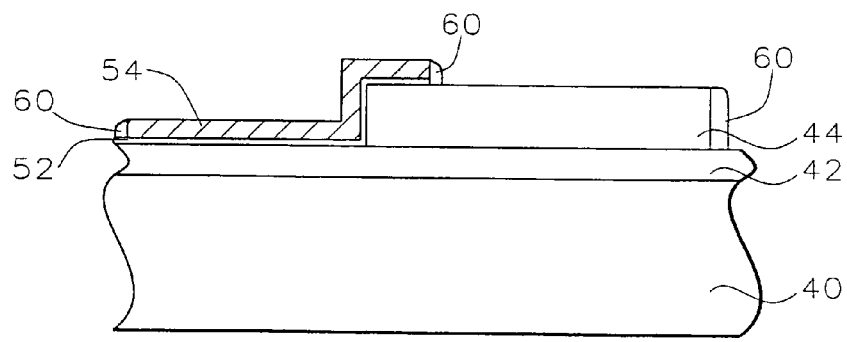

Referring to FIGS. 6 and 7, the gate 54 is in a plane perpendicular to the source/drain fin 46/48/50. The gate 54 partly overlaps the body contact region 44 at one end as shown in the figures. A dielectric layer is blanket deposited over the device structures and anisotropically etched back to leave spacers 60 on the sidewalls of the device structures, as shown in top view in FIG. 7 and in cross-section in FIG. 8. The dielectric layer preferably comprises silicon dioxide or other high dielectric constant dielectric material.

Now, the body contact region is implanted with a P+ implant 62. For example, boron ions are implanted with a dosage of between about 1E14 and 5E15 ions/cm$^2$ at an energy of between about 1 and 50 KeV. The body contact region underlying the gate is the channel region. This has been implanted prior to gate formation with a threshold adjustment implantation, not shown. The source/drain and gate regions are implanted with an N+ implant 64. For example, phosphorus or arsenic ions are implanted with a dosage of between about 1E14 and 5E15 ions/cm$^2$ at an energy of between about 1 and 50 KeV. This will form an NMOS device. For a PMOS device, N+ ions may be implanted into the body contact region and P+ ions into the source and drain regions.

Figure 9:
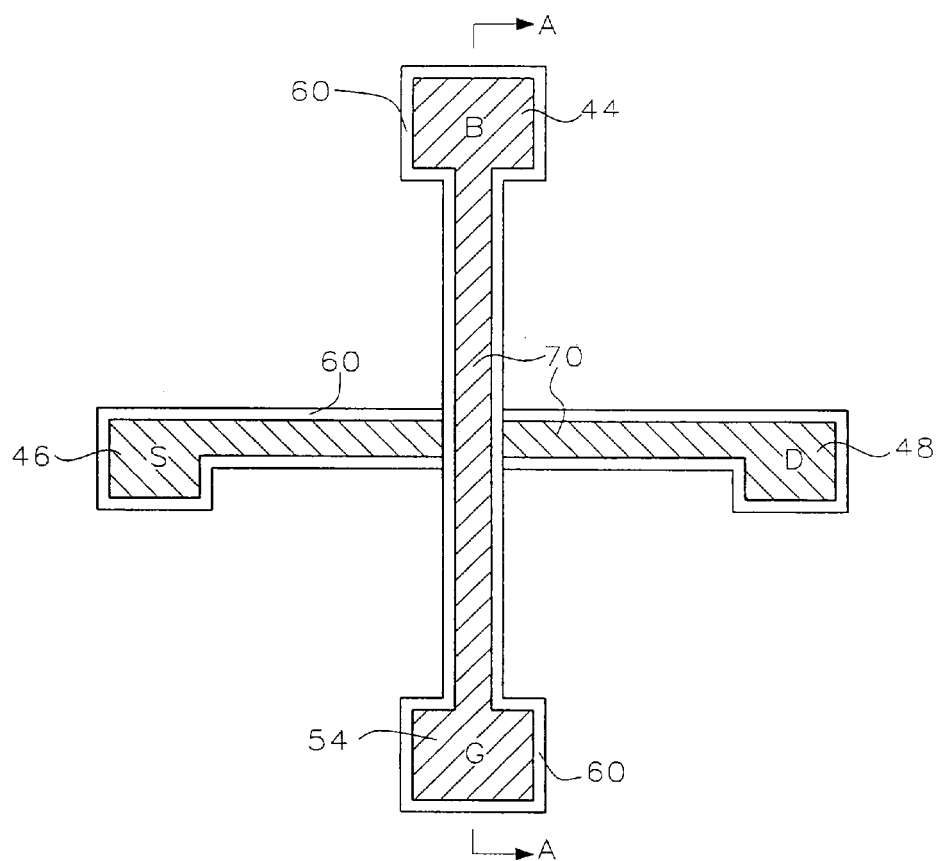
Figure 10:
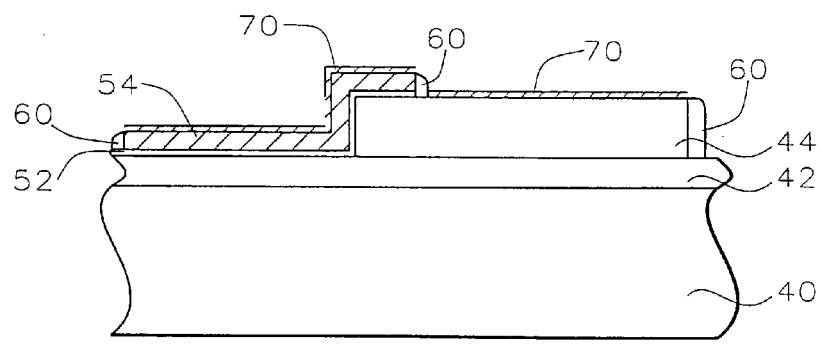

Referring to FIGS. 9 and 10, the source, drain, body region, and gate are to be silicided. Salicidation is performed as is conventional in the art. For example, a metal layer such as titanium, nickel, platinum, erbium, or cobalt is deposited over the structures and subjected to annealing. The metal reacts with the underlying silicon to form a metal silicide such as titanium silicide. The metal overlying dielectric layers such as the insulator layer 42 and the dielectric spacers 60 is unreacted and removed by an etching step. The silicided structures 70 are shown in top view in FIG. 9 and in cross-section in FIG. 10.

Figure 2:
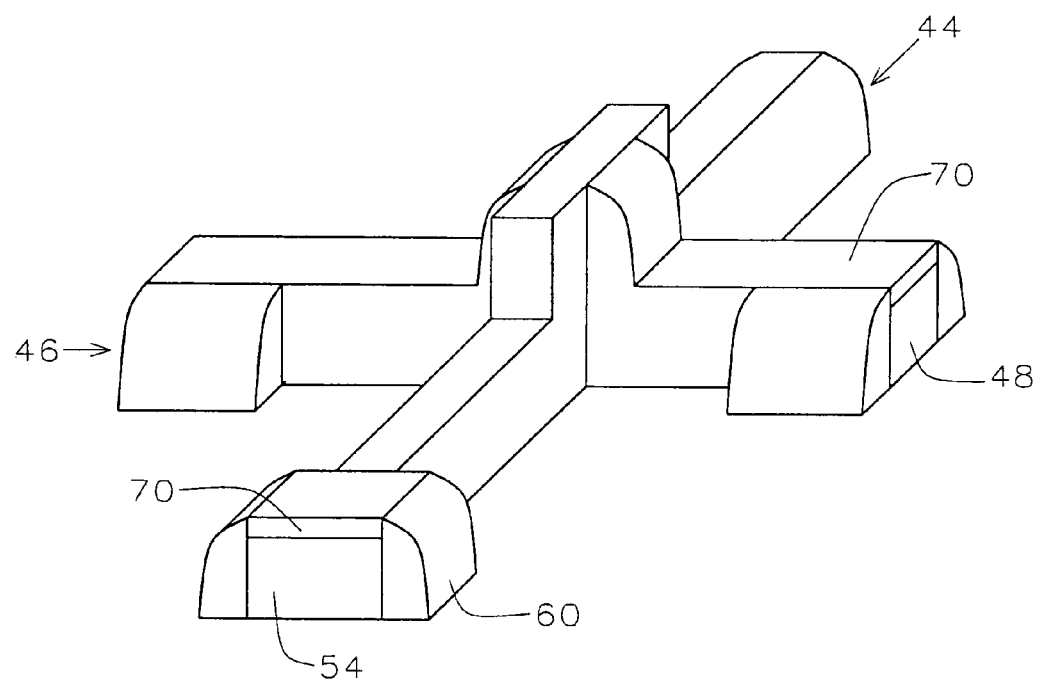
FIG. 2 is an isometric representation of a Finfet device with a body contact according to one embodiment of the present disclosure.

Accordingly, a Finfet with body contact is formed. The body contact provides a contact path to the channel region. FIG. 2 is an isometric view of the completed Finfet. This figure shows a T-shaped active region. The gate 54 contacts the body region 44. This technology can be used in input/output devices, electrostatic discharge (ESD) devices, and in test patterns for monitoring process parameters such as gate oxide integrity (GOI), for example.

Figure 11:
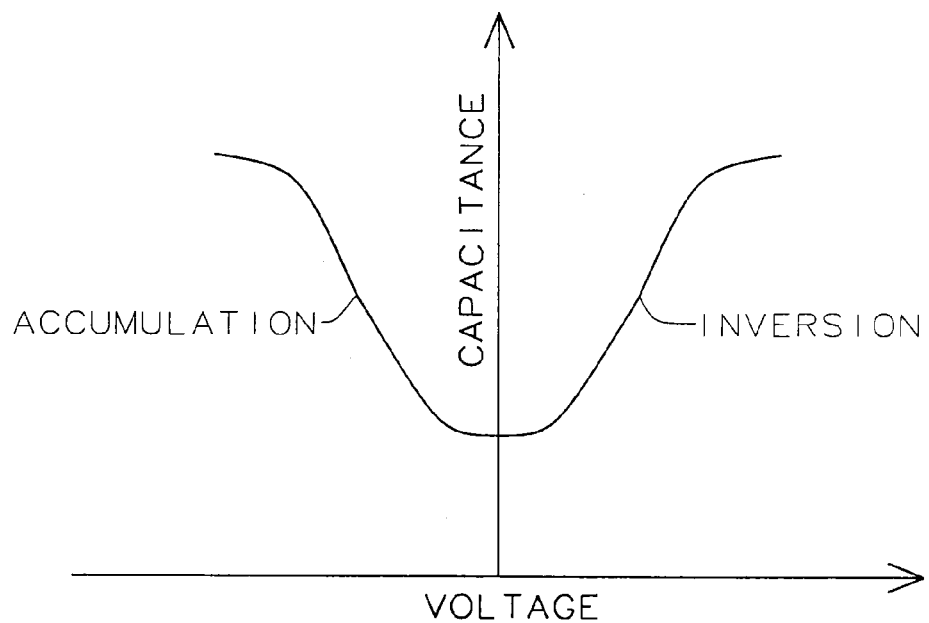
FIG. 11 illustrates a C-V curve for a Finfet device having a body contact.

For example, in a device with a body contact, the gate thickness may be measured using a capacitance to voltage (C-V) curve, as shown in FIG. 11. This C-V curve can be used for lateral gate oxide integrity monitoring if we have a body contact. Gate current can also be monitored if a body contact exists.

Figure 12:
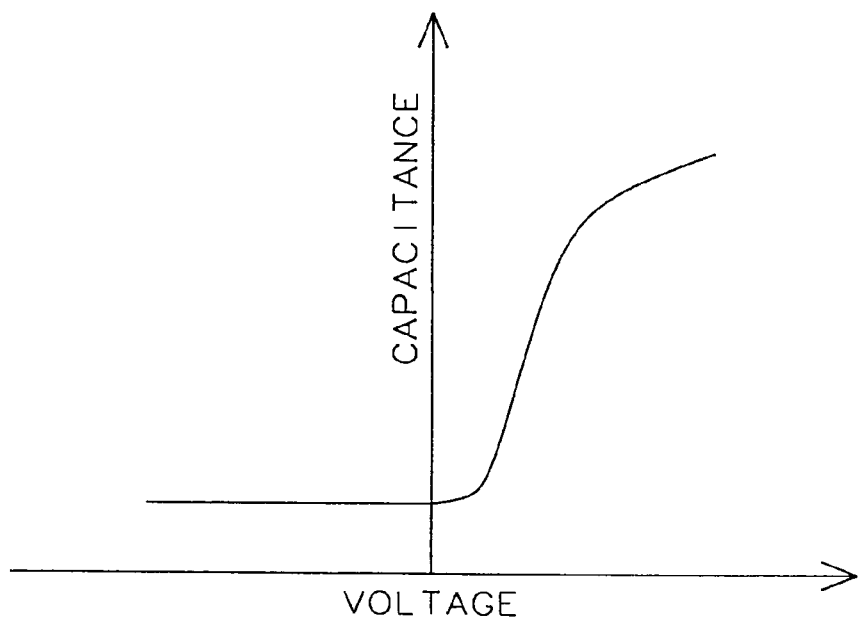
FIG. 12 illustrates a C-V curve for a Finfet device without a body contact.

In a device without a body contact, the C-V curve looks like the curve in FIG. 12. That is, only the gate oxide thickness inversion can be obtained. Parameters such as poly depletion effect and gate leakage cannot be extracted without a body contact.

The process of the present disclosure provides the capability of measuring C-V in GOI devices. Furthermore, some analog circuits need a body contact in order to function; for example, a phase lock loop circuit. The process of the present disclosure is useful in this application as well.

Accordingly, the process of the present invention provides an effective and very manufacturable process for fabricating a Finfet device with body contacts.

While the invention has been particularly shown and described with reference to the preferred embodiments thereof, it will be understood by those skilled in the art that various changes in form and details may be made without departing from the spirit and scope of the invention.

What is claimed is:

1. A Finfet device comprising:
   a T-shaped active region wherein a source region and a drain region form two ends of a cross bar of said T-shaped active region and a central portion of said cross bar forms a channel region and wherein a body contact region forms a leg of said T-shaped active region and wherein said T-shaped active region includes a T-shaped surface in a top-view of said device; and
   a gate electrode overlying a gate dielectric layer perpendicular to said cross bar, wherein an end of said gate electrode partially overlies said body contact region.

2. The device according to claim 1 wherein said active region resides in a silicon layer of a silicon-on-insulator substrate.

3. The device according to claim 1 wherein said gate dielectric comprises gate oxide, nitrided oxide, or a dielectric material having a high dielectric constant greater than 5.

4. The device according to claim 1 wherein said gate electrode comprises polysilicon, polysilicon germanium, or metals.

5. The device according to claim 1 further comprising dielectric spacers on sidewalls of said source, said drain, said body contact region, and said gate electrode.

6. The device according to claim 1 wherein said body contact region is P-doped and said source, said drain, and said gate electrode are N-doped, 7. The device according to claim 1 wherein said body contact region is N-doped and source, said drain, and said gate electrode are P-doped.

8. The device according to claim 1 further comprising a salicide layer overlying said source, said drain, said body contact and said gate electrode.

9. A semiconductor device, comprising:
   a T-shaped active region formed in a silicon layer of a silicon-on-insulator substrate, wherein a source and a drain region form two ends of a cross bar of said T-shaped active region and wherein a channel region forms a central portion of said cross bar and wherein a body contact region forms a leg of said T-shaped active region; and
   a gate structure including a gate electrode formed on a gate dielectric, wherein said gate structure is perpendicular to said cross-bar of said T-shaped active region and extends in a direction opposite said leg of said T-shaped active region;
   wherein said silicon-on-insulator substrate includes an insulating layer, wherein said insulating layer includes a surface on which said T-shaped active region is formed, wherein said T-shaped active region includes a T-shaped surface in a top-view of said device that is parallel to said surface of said insulating layer.

10. The device of claim 9 wherein an end of said gate structure partially overlies said body contact region.

11. The device of claim 9 wherein said gate dielectric comprises gate oxide, nitrided oxide, or a dielectric material having a high dielectric constant greater than 5.

12. The device of claim 9 wherein said gate electrode comprises polysilicon, polysilicon germanium, or metals.

13. The device of claim 9 wherein said body contact region includes a dopant of a first conductivity type, and wherein said source, said drain, and said gate electrode include a dopant of a second conductivity type different from said first conductivity type.

14. The device of claim 9 further comprising dielectric spacers on sidewalls of said source, said drain, said body contact region, and said gate structure.

15. The device of claim 9 further comprising a salicide layer overlying said source, said drain, said body contact and said gate electrode.

* * * * *